(12) United States Patent
Choi et al.

(10) Patent No.: US 6,594,178 B2
(45) Date of Patent: Jul. 15, 2003

(54) METHOD FOR OPTIMIZING DISTRIBUTION PROFILE OF CELL THRESHOLD VOLTAGES IN NAND-TYPE FLASH MEMORY DEVICE

(75) Inventors: Sun-Mi Choi, Kyunggi-do (KR); Yeong-Taek Lee, Seoul (KR)

(73) Assignee: Samsung Electronics Co., Ltd., Suwon (JP)

(*) Notice: Subject to any disclaimer, the term of this patent is extended or adjusted under 35 U.S.C. 154(b) by 0 days.

(21) Appl. No.: 09/872,366

(22) Filed: May 31, 2001

(65) Prior Publication Data

US 2002/0133679 A1 Sep. 19, 2002

(30) Foreign Application Priority Data

Jan. 10, 2001 (KR) .......................................... 2001-1363

(51) Int. Cl.[7] .............................................. G11C 16/04
(52) U.S. Cl. .............................. 365/185.17; 365/185.11
(58) Field of Search ....................... 365/185.17, 185.11, 365/185.14, 185.29, 185.3, 185.13, 185.23

(56) References Cited

U.S. PATENT DOCUMENTS

| | | | | |
|---|---|---|---|---|
| 5,909,392 A | * | 6/1999 | Chang et al. | 365/185.12 |
| 6,134,140 A | * | 10/2000 | Tanaka et al. | 365/185.03 |
| 6,172,909 B1 | * | 1/2001 | Hada et al. | 365/185.19 |

* cited by examiner

*Primary Examiner*—Richard Elms
*Assistant Examiner*—Anh Phung
(74) *Attorney, Agent, or Firm*—Marger Johnson & McCoolom, P.C.

(57) ABSTRACT

A method is operable in a non-volatile memory device of a type having a plurality of blocks formed of a plurality of memory strings in which a plurality of memory cells are connected in series in which a programming operation is conducted after erasing memory cells. The method essentially including the steps of: erasing data held in the memory cells in a unit of the block; and applying a soft program voltage to word lines coupled with the erased memory cells in the unit of the block. The method improves a threshold voltage profile after an erasing cycle, whereby program stress can be minimized in a follow-up program operation.

12 Claims, 14 Drawing Sheets

METHOD FOR OPTIMIZING DISTRIBUTION PROFILE OF CELL THRESHOLD VOLTAGES IN NAND-TYPE FLASH MEMORY DEVICE

CROSS-REFERENCES TO RELATED APPLICATIONS

This application relies for priority upon Korean Patent Application No. 2001-1363, filed on Jan. 10, 2001, the contents of which are herein incorporated by reference in their entirety.

BACKGROUND OF THE INVENTION

1. Field of the Invention

The present invention relates generally to flash memory devices electrically capable of erasing and programming, and more particularly to a method for optimizing the distribution profile of cell threshold voltage erased in a NAND-type flash memory device.

2. Description of the Prior Art

Flash memory devices have an excellent data storage capacitance as one kind of non-volatile devices which erase and program data using a tunneling phenomenon. In addition, the devices have not only lower power consumption than that of hard disk but also exhibit excellent durability against external impacts, which makes flash memory extremely useful in portable apparatuses as an auxiliary memory device.

There are two main types of flash memory: those based on NAND logic devices and those that are NOR-based. NAND-type flash memory devices in which a certain number of memory cells are connected in series. NOR-type flash memory devices include memory cells connected in parallel. NAND devices typically require smaller memory cells relative to NOR devices and thus are more economical for large storage capacitances.

FIG. 1 shows a schematic of a general NAND flash memory device. Referring to FIG. 1, the NAND flash memory device includes a memory cell array 10 divided into a plurality of blocks, page buffers 20 and 30 that detect and store input/output data of the memory cell, a row decoder 40 that selects word lines of the memory cell array 10, and column decoders 50 and 60 that control input/output of data in the page buffers 20 and 30. In the memory cell array 10, a plurality of memory cells coupled serially with a single bit line BL form a string. The plurality of memory cells are divided into a unit of a page based on the memory cells coupled with a word line WL, and divided into a unit of a block B1 through Bn formed of a plurality of the pages. A size of the block is generally dependent on the number of the strings connected to the single bit line BL. Such NAND flash memory devices perform read-out and programming operations in the unit of the page, and erasing operations in the unit of the block.

When data is read-out, a string selection transistor SST and a ground selection transistor GST are turned on to connect a memory string MS to the bit line BL. Then, a reference voltage (usually zero volts) is applied to a selected word line WL, while a read-out voltage is applied to the rest of the word lines. Here, the read-out voltage is higher than a threshold voltage of an erased or programmed memory cell, and zero V is applied to common source line CSL. As a result, it is determined whether the selected memory cell is an on-cell or an off-cell by detecting whether current flows in the corresponding memory string MS or not. If the selected memory cell is determined as the off-cell, the memory cell is in a programmed state; while if the selected memory cell is determined as the on-cell, the memory cell is in an erased state.

In an erasing operation in the unit of the block, source and drain are placed in a floating state, i.e., have no bias voltage, and then an erase voltage Ver of about 24 V is applied to bulk, as shown in the following <TABLE 1>. Further, the string selection signal SS and ground selection signal GS are respectively coupled to power supply voltage Vcc for string selection line SSL and ground selection line GSL of the entire blocks to be floated so that stresses caused from a positive high voltage applied to the bulk are relieved. Then, the word lines WL of the selected block are coupled to zero V, and the word lines WL of the unselected block are floated in order not to be erased.

TABLE 1

| Classification | Selected block | | Unselected block | |
|---|---|---|---|---|
| | On-cell BL | Off-cell BL | On-cell BL | Off-cell BL |
| BL | Floating → Ver | | Floating → Ver | |
| SSL | Floating → Ver | | Floating → Ver | |
| WL | Vss (ground voltage) | | Floating → Ver | |
| GSL | Floating → Ver | | | |
| CSL | Floating → Ver | | | |
| P-type/N-type bulk | Ver (about 24 V) | | | |

After the erase operation in the unit of the block, the read-out operation for verifying the erase is carried out to detect "PASS" or "FAIL", and the result is stored in a status register to complete the erasing operation.

The lines or regions which are floated in the erase operation are charged up to a voltage increased by capacitive coupling caused from the high-leveled erase voltage Ver applied to the bulk in accordance with the erase voltage level during the erasing operation. In other words, if the floating gate is coupled with the erased memory cell, stored charges thereof do not tunnel to the bulk regions since the unselected word lines on the floating state rise up to a predetermined potential with being capacitive coupled with the erase voltage applied to the bulk.

In the program operation in the unit of the page, zero V is applied to the bit line BL of the memory cell to be programmed, and a high-leveled program voltage Vpgm is applied to the corresponding word line WL. Then, the threshold voltage is increased by tunneling electrons from a channel (or bulk) to a floating gate. This is shown in the following <TABLE 2> that shows a voltage bias status when memory cell M13 is selected for the program operation.

TABLE 2

| Classification | Selected block | | Unselected block | |
|---|---|---|---|---|
| | On-cell BL | Off-cell BL | On-cell BL | Off-cell BL |
| BL | 0 V | Vcc | 0 V | Vcc |
| SSL | Vcc | | 0 V | |
| Unselected WL15 | Vpass(7~10 V) | | Floating | |
| Unselected WL14 | 0 V | | Floating | |
| Selected WL13 | Vpgm (14~20 V) | | Floating | |
| Unselected WL12 | 0 V | | Floating | |

TABLE 2-continued

| Classification | Selected block | | Unselected block | |
| --- | --- | --- | --- | --- |
| | On-cell BL | Off-cell BL | On-cell BL | Off-cell BL |
| Unselected WL11~WL0 | Vpass | | Floating | |
| GSL | 0 V | | Floating | |
| CSL | | Vss | | |
| P-type/N-type bulk | | 0 V | | |

There are memory cells that are to be programmed (program cell) as well as other memory cells that are intended to be prevented from programming (program-inhibit cell) within a single page. For the purpose of preventing such undesirable programming, channel voltage is self-boosting due to the capacitive coupling between the gate and the channel. As a result, the voltage difference between the gate and the channel is so small such that the electrons do not tunnel to the floating gate, thereby preventing the programming operation. Boosting loss caused from charge sharing is suppressed by applying zero V to word lines WL12 and WL14 adjacent to the selected word line WL13. This improves the efficiency of the device by preventing the undesirable programming through self-boosting. Such an operating manner is called local self-boosting.

In the program process, if threshold voltage profile of the erased memory cells is wide, the self-boosting efficiency is degraded by leakage current. In particular, since over-erased memory cells distributed on the lowest region of the threshold voltage profile are programmed faster than the other memory cells, these cells are easy to be over-programmed after the program operation.

In FIG. 2A, memory cell M12oe is over-erased (i.e. a threshold voltage of a memory cell disposed in lower part in a string has much lower value than that of the memory cell which has program stress in upper part) assuming that memory cell M13pd, positioned in the same word line with the selected memory cell M13, receives stress during the program). If so, there is the leakage current flowing in the direction of the dotted arrows until the channel voltage of the memory cell M13pd is boosted up to more than an absolute value (6V) of the threshold voltage (about −6V; an over-erased state) of the memory cell M12oe.

As shown in FIG. 2B, the leakage current causes the boosted channel voltage Vch1 (about 9V) to fall down to Vch2 (about 6V). The memory cell M13pd thence receives the program stress and the program-inhibit is extinguished. Memory cell M13pi, on normally erased memory cell M12ne having a threshold voltage of about −3V, does not have leakage current because of the voltage-drop between the drain-source caused by the boosted channel voltage Vch1 of about 9V.

SUMMARY OF THE INVENTION

It is therefore an object of the present invention to provide a method for minimizing a width of a threshold voltage profile in a NAND flash memory device.

It is another object of the invention to provide a method for improving program-inhibit efficiency during a programming operation in the NAND flash memory device.

It is still another object of the invention to provide a method for minimizing program stress in the NAND flash memory device which carries out a programming operation after an erasing operation.

In order to attain the above objects, soft program in a unit of the block is performed in memory cells which are determined to be passed during a verifying operation for memory cells which are processed in an erase operation, so that threshold voltage of over-erased memory cells is increased. Further, threshold voltage profile becomes narrow by performing soft erase for the memory cells having the increased threshold voltage to a positive direction after the soft program.

According to an aspect of the present invention, there is provided a method operable in a non-volatile memory device in which a programming operation is conducted after erasing memory cells and which has a plurality of blocks formed of a plurality of memory strings in which a plurality of memory cells are connected in series, the method including the steps of: erasing data held in the memory cells in a unit of the block; and applying a soft program voltage to word lines coupled with the erased memory cells in the unit of the block.

According to another aspect of this invention, there is provided a method operable in a non-volatile memory device in which a programming operation is conducted after erasing memory cells and which has a plurality of blocks formed of a plurality of memory strings in which a plurality of memory cells are connected in series, the method including: a first step erasing data held in the memory cells in a unit of the block; a second step applying a soft program voltage to word lines coupled with the erased memory cells in the unit of the block; and a third step performing erasing operation for the erased and soft programmed memory cells by employing a soft erase voltage in the unit of the block.

The soft program voltage is lower than a voltage employed in the program, and the soft erase voltage is lower than a general erase voltage.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

In the present invention, for the purpose of improving threshold voltage profile, a soft program in a unit of a block (block soft program: it is referred as 'BSP' hereinafter) and a soft erase in the unit of the block (block soft erase: it is referred as 'BSE' hereinafter) are employed.

Figure 1:
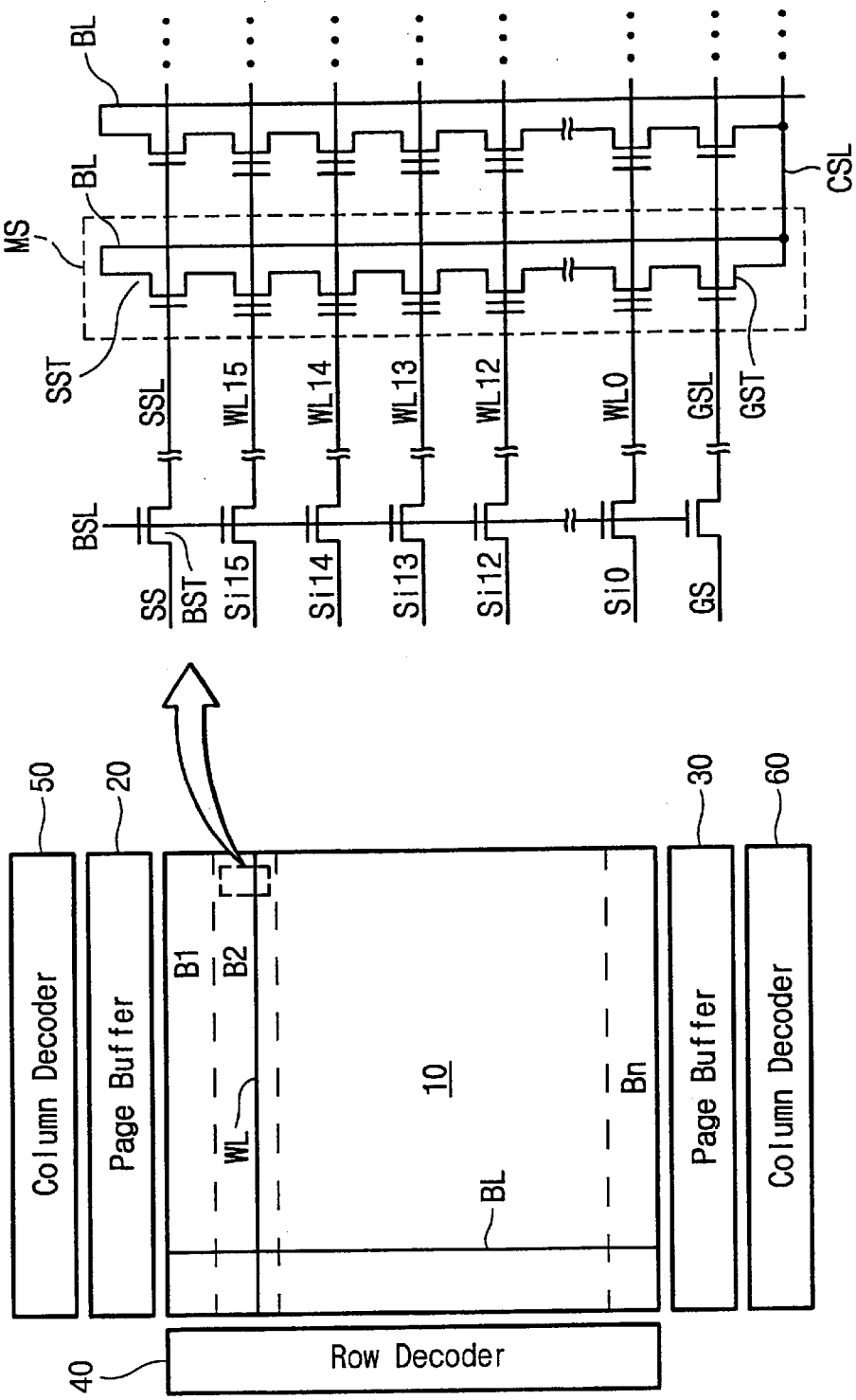
FIG. 1 shows a general NAND-type flash memory device known in the prior art.
Figure 2A:
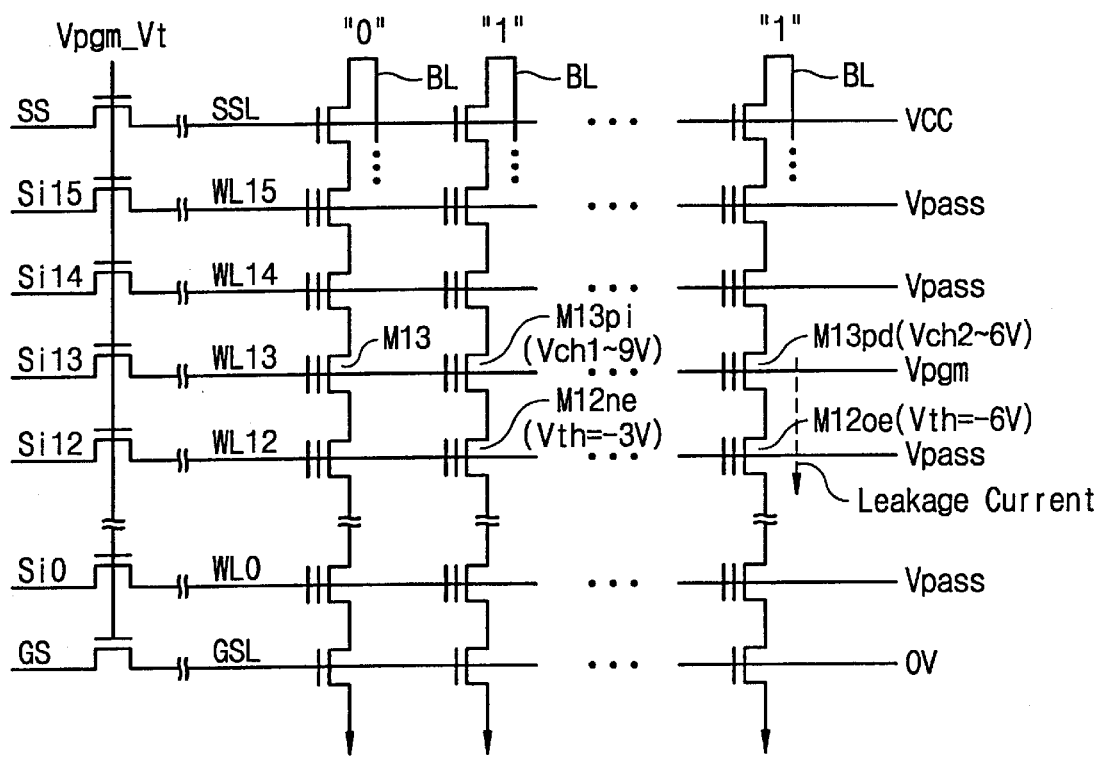
FIGS. 2A and 2B show problems of the conventional art.
Figure 2B:
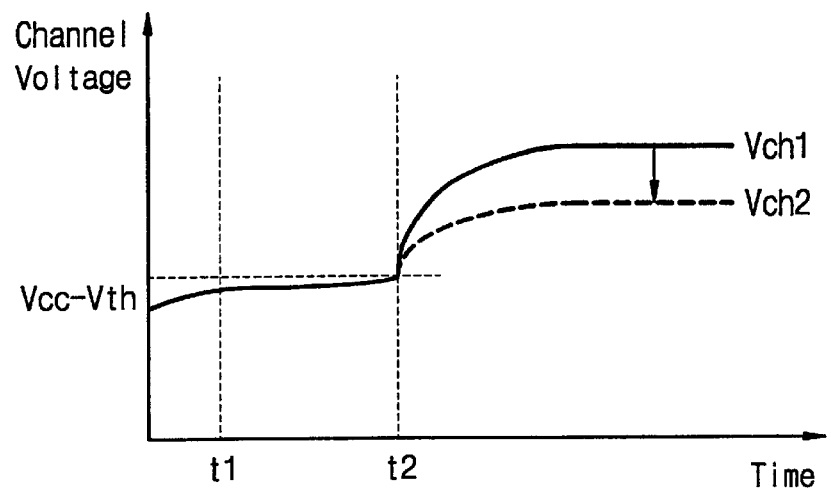
Figure 3:
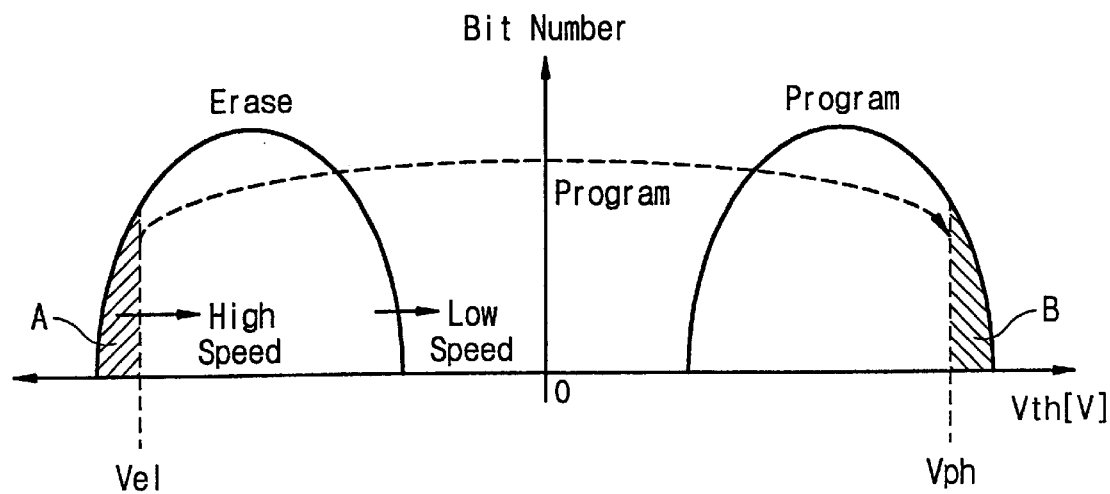
FIG. 3 is a graph showing a profile variation of threshold voltage in a block soft program according to an embodiment of the present invention.

Referring to FIG. 3, the BSE drops threshold voltages B in over-programmed memory cells in a region of the highest threshold voltage of the profile down to less than an upper program voltage limit Vph. The BSP raises threshold voltage A in over-erased memory cells in a region of the lowest threshold voltage of the profile up to more than lower erase voltage limit Vel. Comparing with the prior art methods illustrated in <TABLE 1>employing erase voltage Ver of about 24V, the BSE of the present invention applies a soft erase voltage Ves of about 20V lower than the erase voltage Ver to a bulk region. Briefly, 0V is applied to an entire word lines in a selected block, and the soft erase voltage Ves of about 20V is applied to the bulk region. And the other lines are placed in be a floating state having no bias voltage regardless of the selected block or not.

TABLE 3

| Classification | Selected block | | Unselected block | |
|---|---|---|---|---|
| | On-cell BL | Off-cell BL | On-cell BL | Off-cell BL |
| BL | Floating → Ves | | Floating → Ves | |
| SSL | Floating → Ves | | Floating → Ves | |
| WL | Vss | | Floating → Ves | |
| GSL | | Floating → Ves | | |
| CSL | | Floating → Ves | | |
| P-type/N-type bulk | | Ves (about 20 V) | | |

Figure 4:
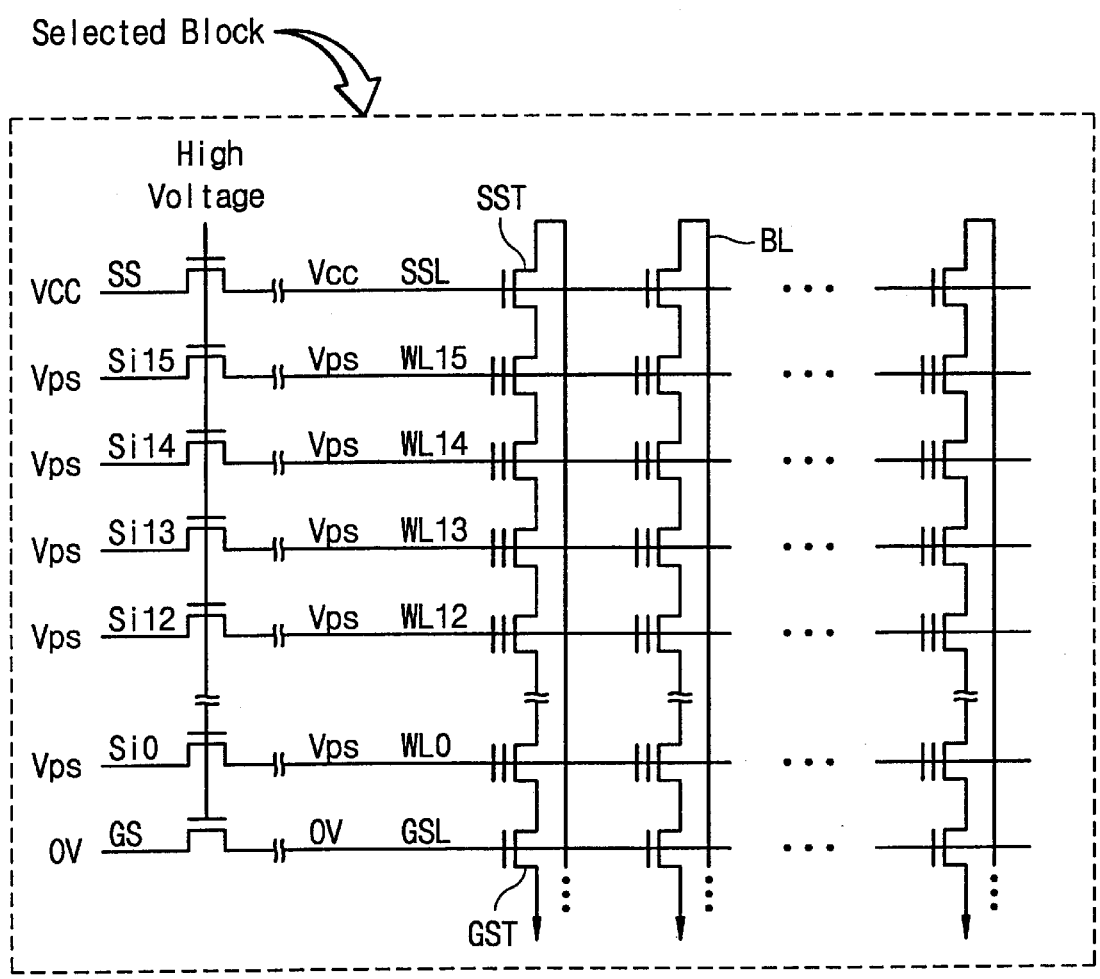
FIG. 4 is a circuit diagram showing a way of applying voltage in the block soft program according to an embodiment of the present invention.

The BSP then operates in the bias condition of the following <TABLE 4>. Referring to FIG. 4, in a selected block for the BSP, a soft program voltage Vps of about 13V between pass voltage Vpass and program voltage Vpgm (Vpass<Vps<Vpgm) is applied to entire word lines WL0~WL15 when string selection transistors SST are turned on, and ground selection transistors GST are turned off.

TABLE 4

| Classification | Selected block | | Unselected block | |
|---|---|---|---|---|
| | On-cell BL | Off-cell BL | On-cell BL | Off-cell BL |
| BL | 0 V | Vcc | Floating (No Bias) | |
| SSL | Vcc | | 0 V | |
| WL | Vps (about 13 V) | | Floating | |
| GSL | Vps (about 13 V) | | Floating | |
| CSL | | | Vss | |
| P-type/N-type bulk | | | 0 V | |

After the BSP is applied, the whole profile including the threshold voltage of the over-erased memory cells moves to the right side. Since a programming speed of the over-erased memory cells is much faster, the BSP is therefore useful for improving the threshold voltage profile in the erase side.

Figure 5:
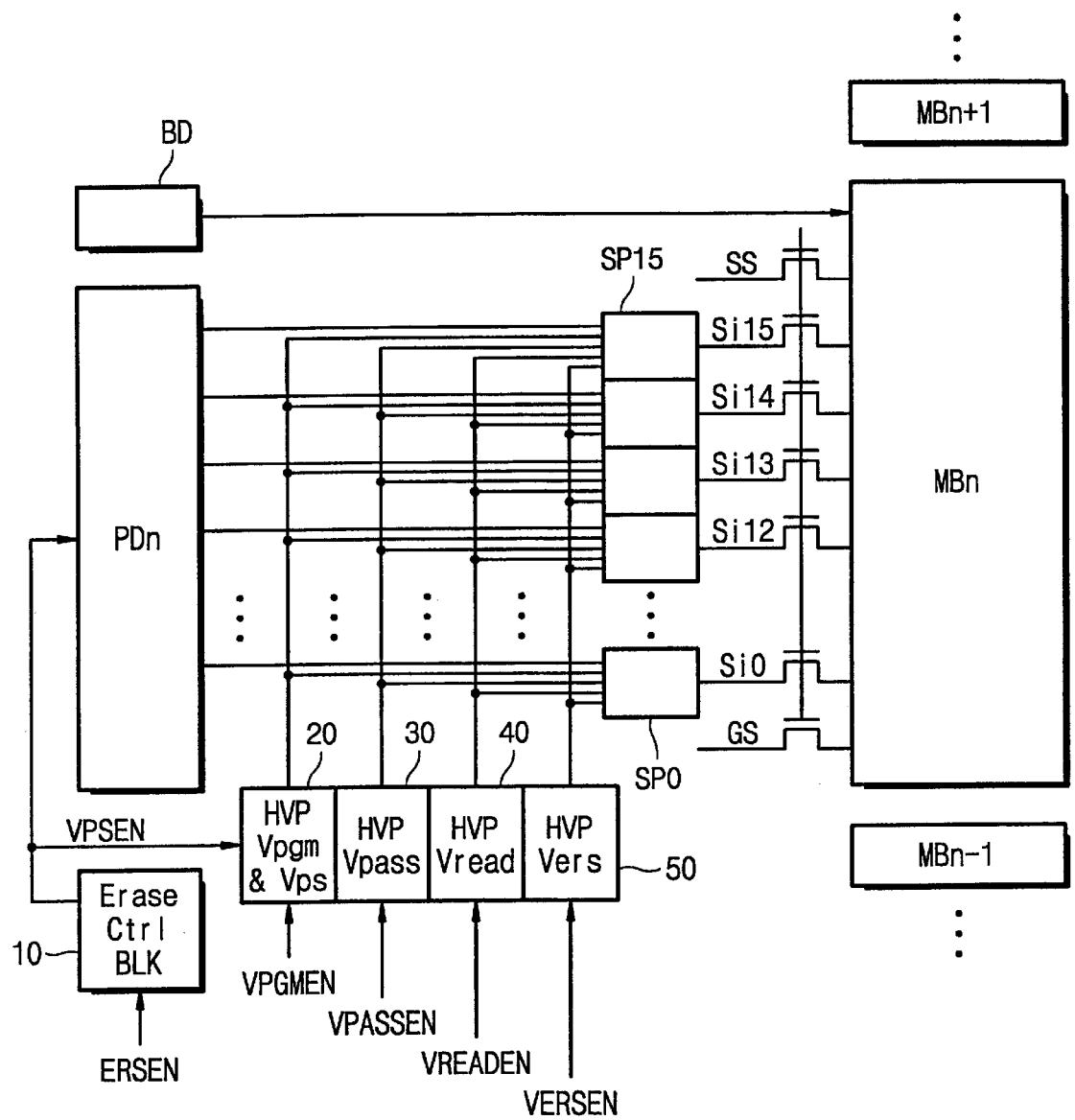
FIG. 5 is a schematic diagram showing the arrangement of non-volatile memory device employed in the present invention.

FIG. 5 schematically shows the disposition of high-voltage generating circuits for the BSE or BSP operations in a non-volatile semiconductor memory device. The high-voltage generating circuits 20, 30, 40, and 50—generating the program voltage/soft program voltage VpgmN/Vps, the pass voltage Vpass, read-out voltage Vread and the erase voltage Vers—receive respective enable signals VPGMEN, VPASSEN, VREADEN, and VERSEN. A soft program voltage enable signal VPSEN is also provided to the high-voltage generating circuit 20 which provides the program voltage/soft program voltage Vpgm/Vps, and also provided to a predecoder PDn. The signal VPSEN is provided from an erase control block 10 which operates in response to an erase enable signal ERSEN. The respective voltages Vpgm/Vps, Vpass, Vread, and Vers provided from the high-voltage generating circuits 20, 30, 40, and 50 are commonly applied to switch pumps SP0 through SP15. The switch pumps SP0~SP15 supply a voltage in accordance with an operation mode for the selected block shown in FIG. 4 by way of selection transistors SS, Si0 through Si15 and GS in response to a predecoding signal provided from the predecoder PDn. The selection transistors SS, Si0~Si15, and GS connect outputs of the switch pumps SP0~SP15 to a corresponding memory block MBn in response to a block selection signal (not shown). The construction of FIG. 5 shows basic elements for the BSP after the erase operation.

Figure 6:
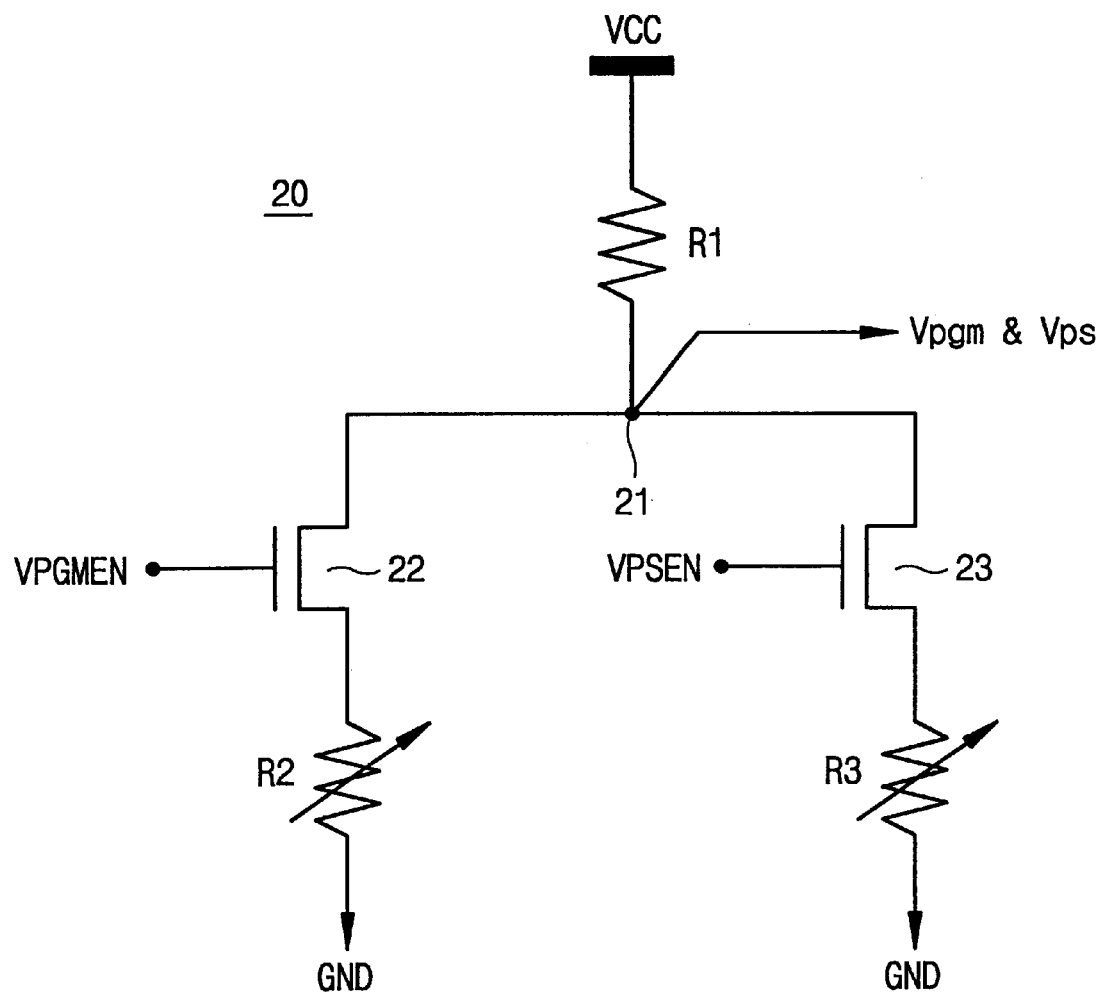
FIG. 6 is a circuit diagram showing a generation of program voltage/soft program voltage of FIG. 5.

The Vpgm/Vps generating circuit 20 of FIG. 5 is embodied in FIG. 6. Referring to FIG. 6, the circuit 20 includes a resistor R1 connected between power supply voltage VCC and an output terminal 21. A NMOS transistor 22 and a variable resistor R2 are serially connected between the output terminal 21 and ground voltage GND. The other NMOS transistor 23 and the other variable resistor R3 are serially connected between the output terminal 21 and the ground voltage GND. The respective variable resistors R2 and R3 can be constructed of various known elements such as a composition of programmed transistor cells or dynamic resistors.

Figure 7:
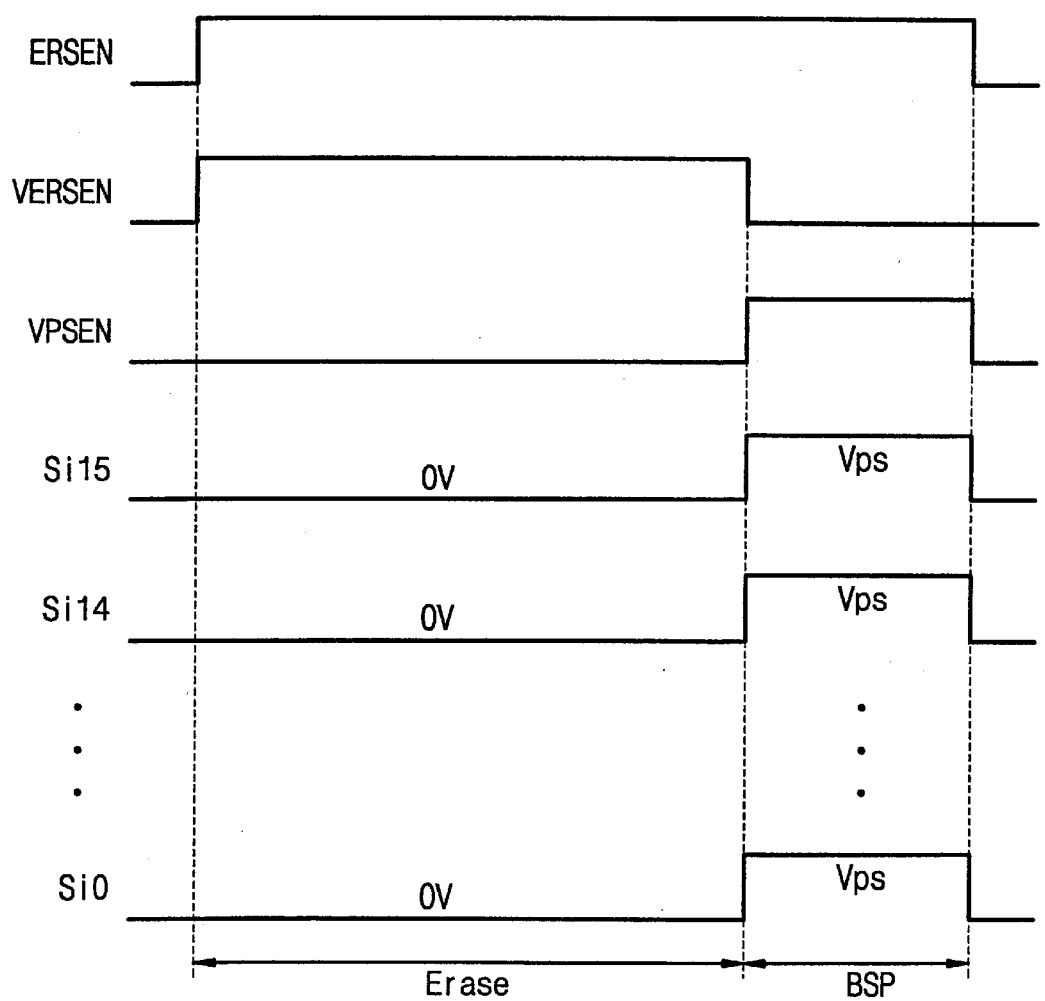
FIG. 7 is a timing diagram showing an operation of the circuit shown in FIG. 6.

Referring to FIG. 7 which is a timing diagram showing an operation of the circuit shown in FIG. 6, the erase enable signal ERSEN is activated on high level during an erase cycle ERASE and a soft program cycle BSP. The erasing operation is conducted in an activated state of the erase voltage enable signal VERSEN on high level, and the soft program is conducted in an activated state of the soft program voltage enable signal VPSEN on high level. When the signal VPSEN is activated to high level to turn the transistor 23 on, the other transistor 22 is turned off by the corresponding inactivated state of the program voltage enable signal VPGMEN.

Next, various embodiments to improve the threshold voltage profile of the erased memory cells basically using the BSP or BSE are explained with reference to FIGS. 8 through 11.

Figure 8:
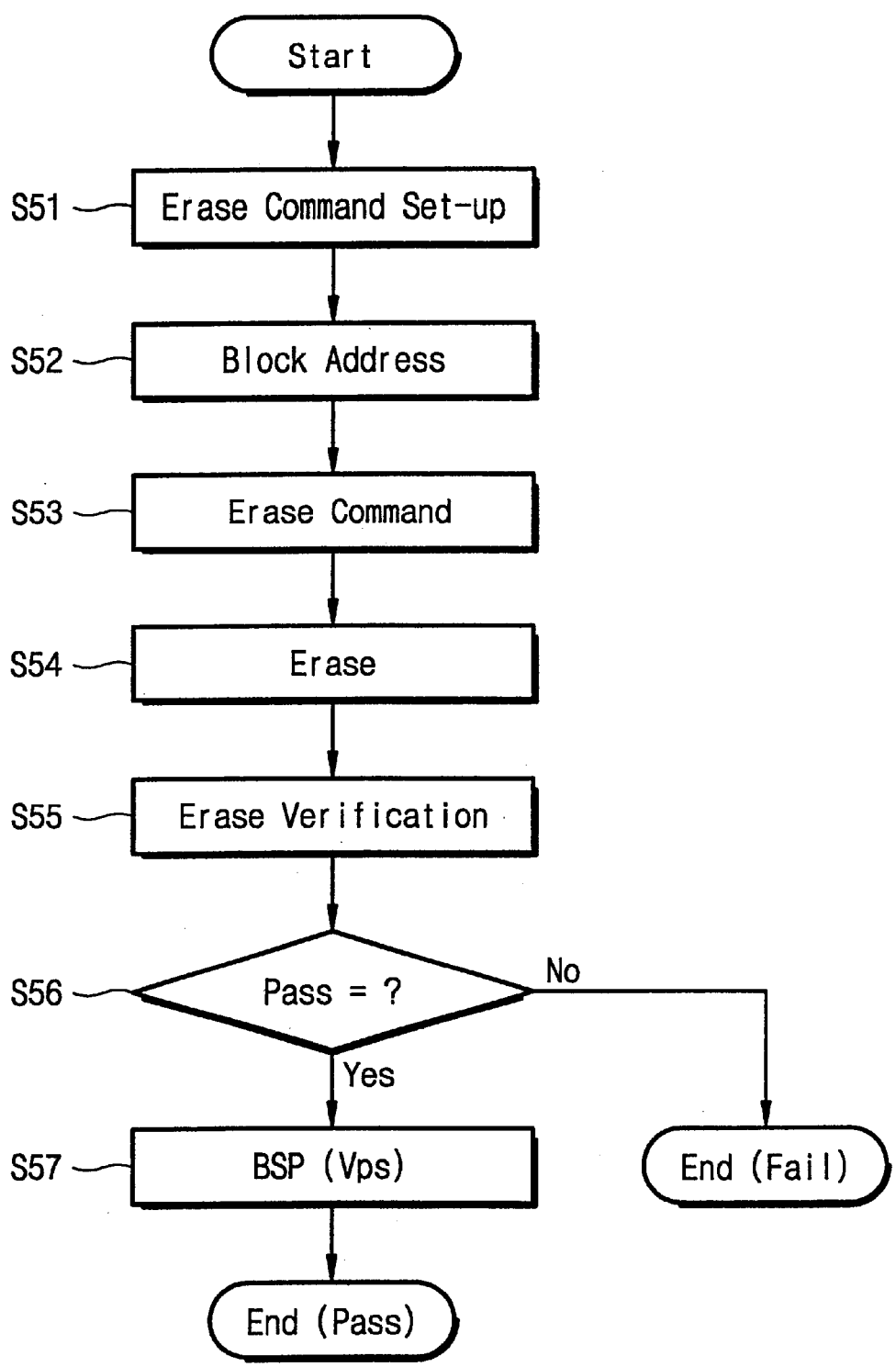
FIG. 8 is a flow chart showing an erase cycle according to a first embodiment of the present invention.

FIG. 8 is a flow chart of performing the BSP after a verification read-out. Steps from S51 to S55 constitute a basic erase operation (erase command set-up—block address—erase command—erase—erase verification), and then pass/fail is determined at step S56. If the erase operation is determined to have failed, the erase cycle is terminated after treating the block as a bad block and storing the fail result in a register. If the operation is determined to have passed, the BSP is performed at step S57 to cure the over-erased memory cells, and outputs the result of the passed-state.

Figure 9:
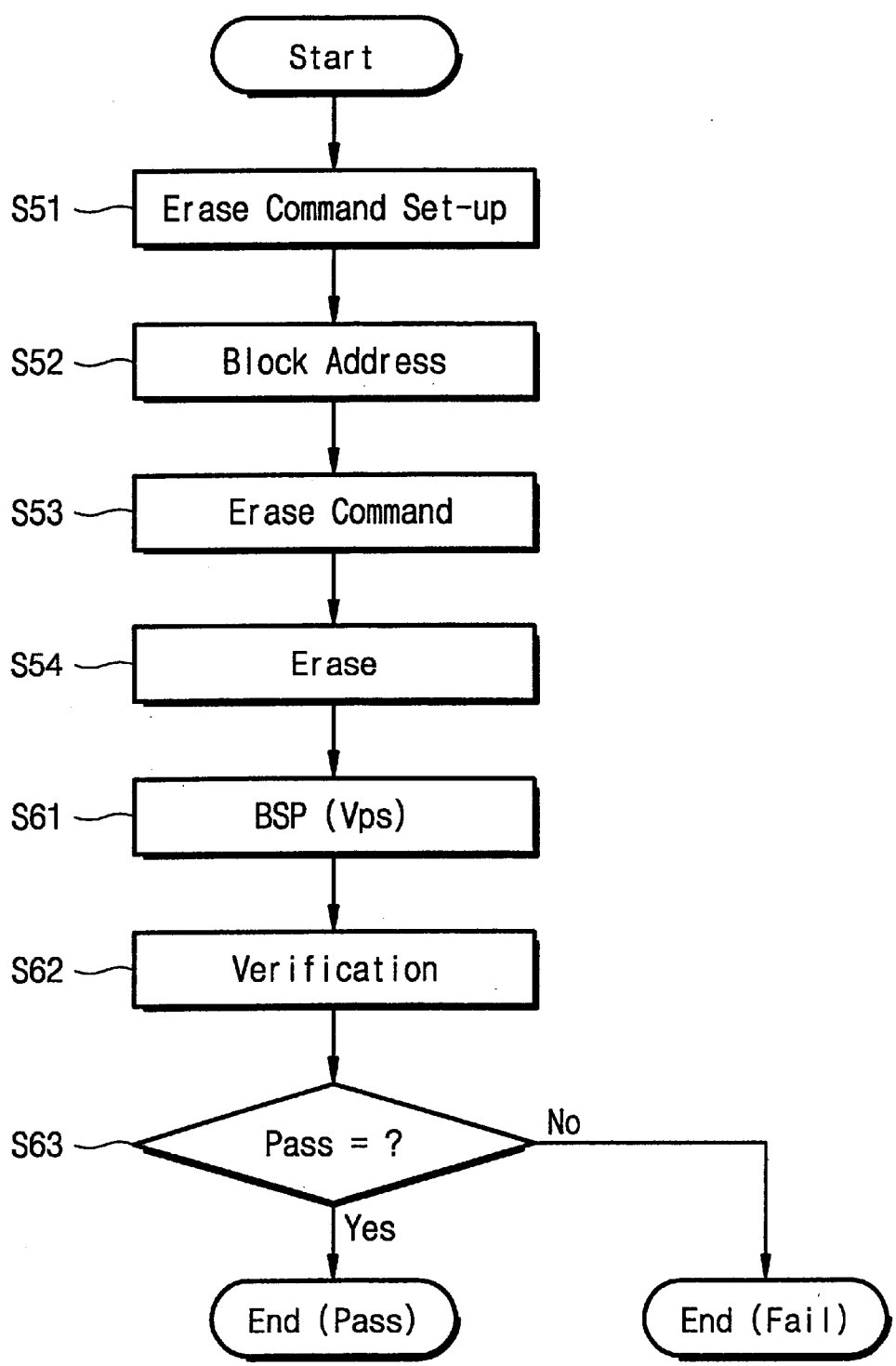
FIG. 9 is a flow chart showing an erase cycle according to a second embodiment of the present invention.

An embodiment of FIG. 9, where the BSP is performed before the verification read-out operation, has substantially the same profile variation of the threshold voltage with the result of FIG. 8. The BSP is performed at step S61 after the erase operation. The verification read-out operation is performed at the next step S62, and the pass/fail is determined at step S63. The pass/fail result is stored in the register regardless of the determined result of the pass/fail, and then the cycle is over.

Figure 12A:
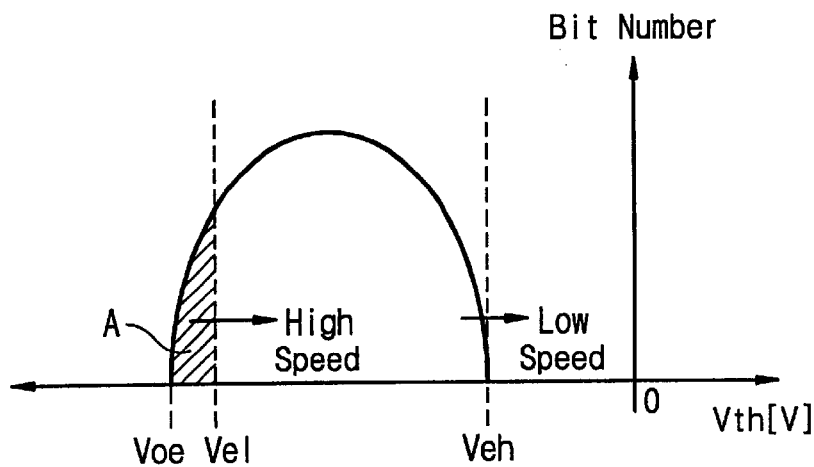
FIGS. 12A and 12B are graphs showing profile variations of the threshold voltage according to the first and second embodiments.
Figure 12B:
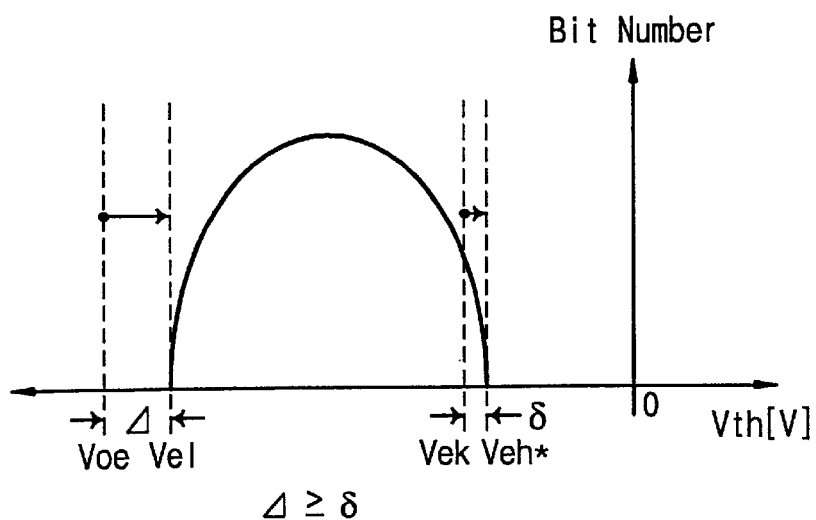

FIG. 8 and FIG. 9, because of the changed order of the verification and BSP steps, exhibits different over-erased threshold profiles, shown in FIGS. 12A and 12B respectively. In other words, the threshold voltages in an over-erase region A between the lower erase voltage limit Vel and an over-erase voltage Voe is removed after the BSP. Meanwhile, an upper erase voltage limit Veh moves δ in a positive direction by the BSP to Veh* The δ, however, is narrower than a moved width of the threshold voltage in the over-erase side Δ (δ<Δ) because of the relatively high-programming speed of the over-erased memory cells.

Generally, in the case of a narrow range of δ from Veh to Veh*, there is not a problem in the consequent profile, because the threshold voltage of the erased memory cell is placed in the negative region. However, if the width δ is so wide such that the erased memory cell would not meet an optimal erase threshold voltage profile, other embodiments shown in FIG. 10 and FIG. 11 can be employed.

Figure 10:
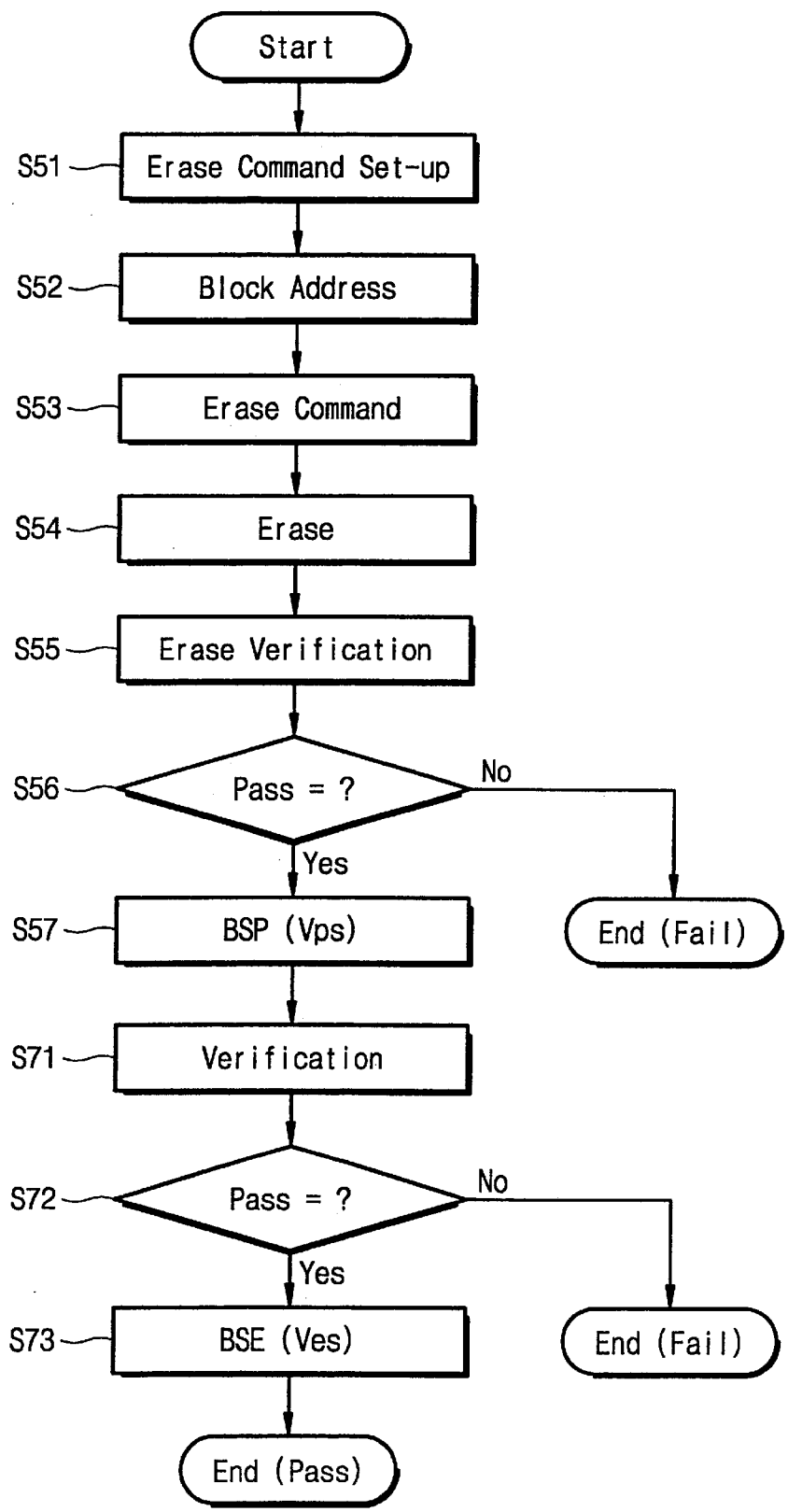
FIG. 10 is a flow chart showing an erase cycle according to a third embodiment of the present invention.

FIG. 10 illustrates a method practiced according to an alternative embodiment of the invention where a verification step is omitted after the BSP and BSE. As shown in FIG. 10, the steps of FIG. 8 (erase—erase verification—BSP) are performed till step S57, and then a verifying operation is performed at step S71. Next, the erase cycle for the memory cells which are determined to have failed is over, and the memory cells are treated as a bad block. The BSE is performed for the memory cells which are determined to have passed including the over-erased memory cells at step S73, and then the erase cycle is over.

Figure 11:
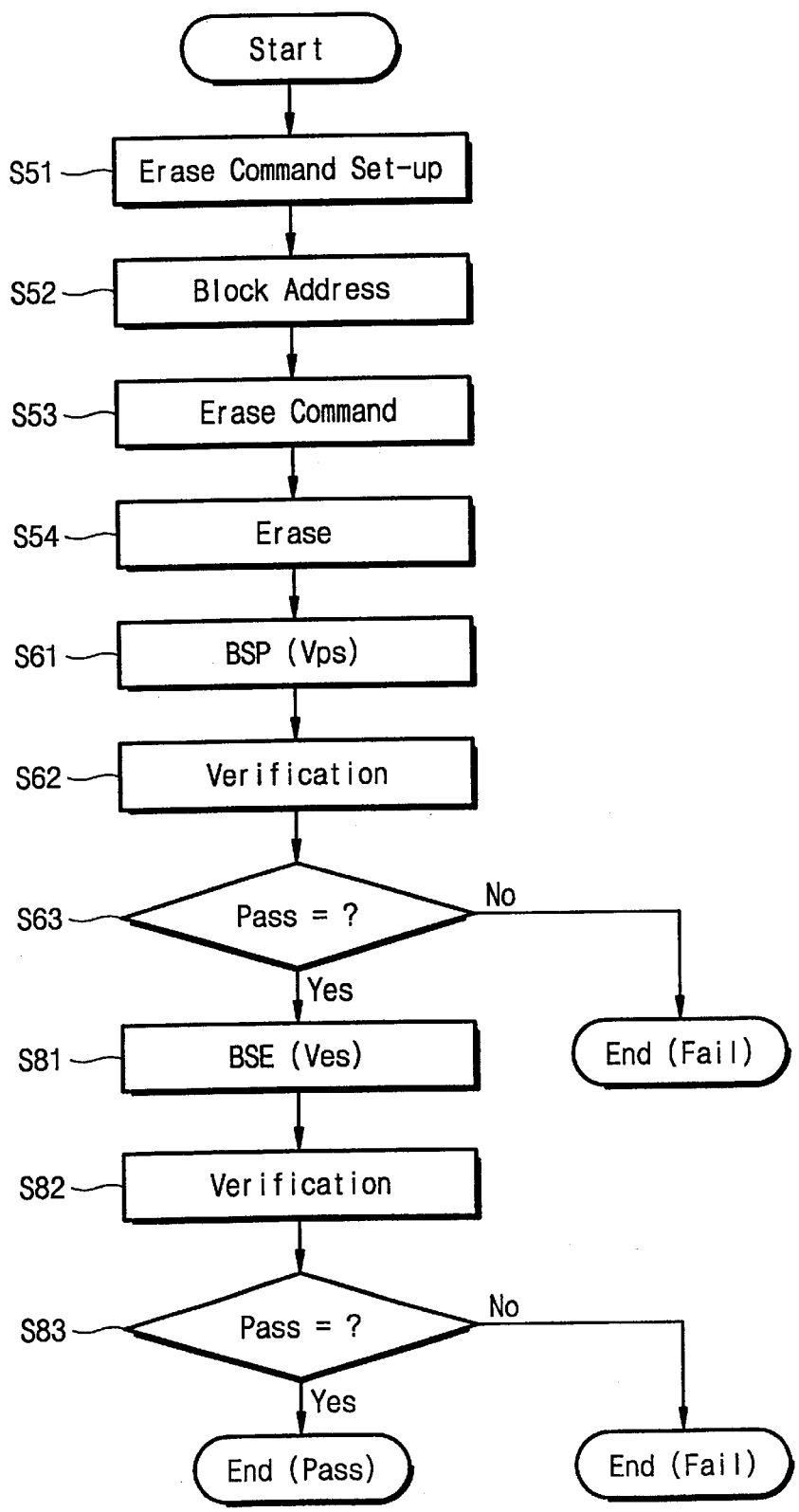
FIG. 11 is a flow chart showing an erase cycle according to a fourth embodiment of the present invention.

FIG. 11 shows an alternate method where a verification step is performed after the BSP and BSE. After the steps of FIG. 9 (erase—BSP—erase verification) are performed till step S63, the BSE is performed only for the passed memory cells including the over-erased memory cells at step S81. The erase cycle for the memory cells which are determined to have failed at step S63 is over. After the step SS1, the erase cycle is over thereafter, a verifying operation is performed at step S82, and then the state of pass or fail is determined at step S83.

The methods shown in FIGS. 8 and 9 are performed to control the threshold voltage profile for the over-erased memory cells, while the methods shown in FIGS. 10 and 11 add a BSE step that helps control the positive move part of the upper erase voltage limit Veh after the BSP step. The threshold voltage profile resulting from the methods of FIGS. 10 and 11 are shown in the graph of FIG. 13C.

Figure 13A:
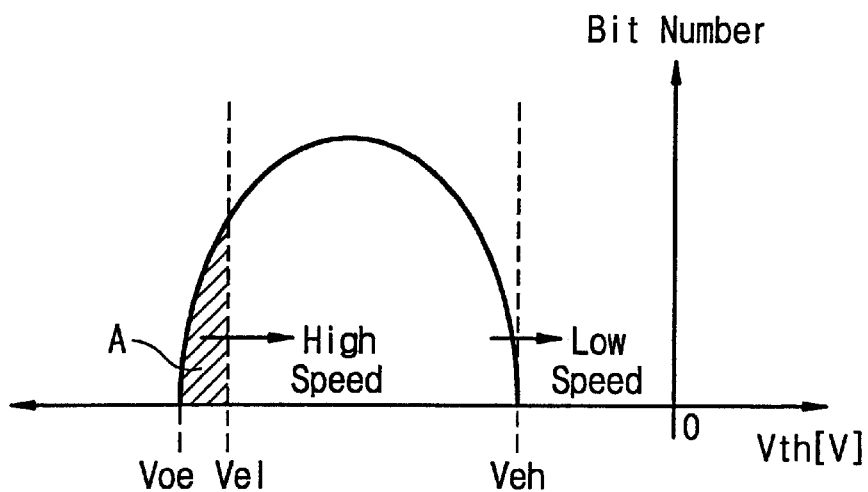
FIGS. 13A and 13B are graphs showing profile variations of the threshold voltage according to the third and fourth embodiments.
Figure 13B:
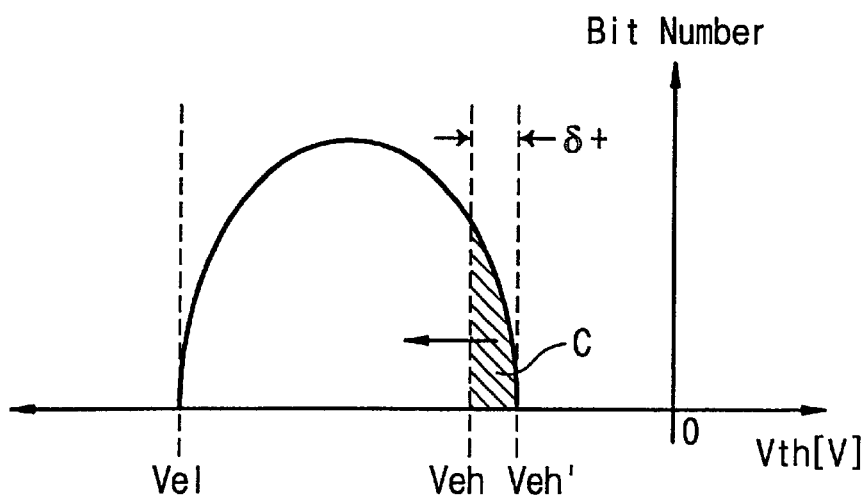
Figure 13C:
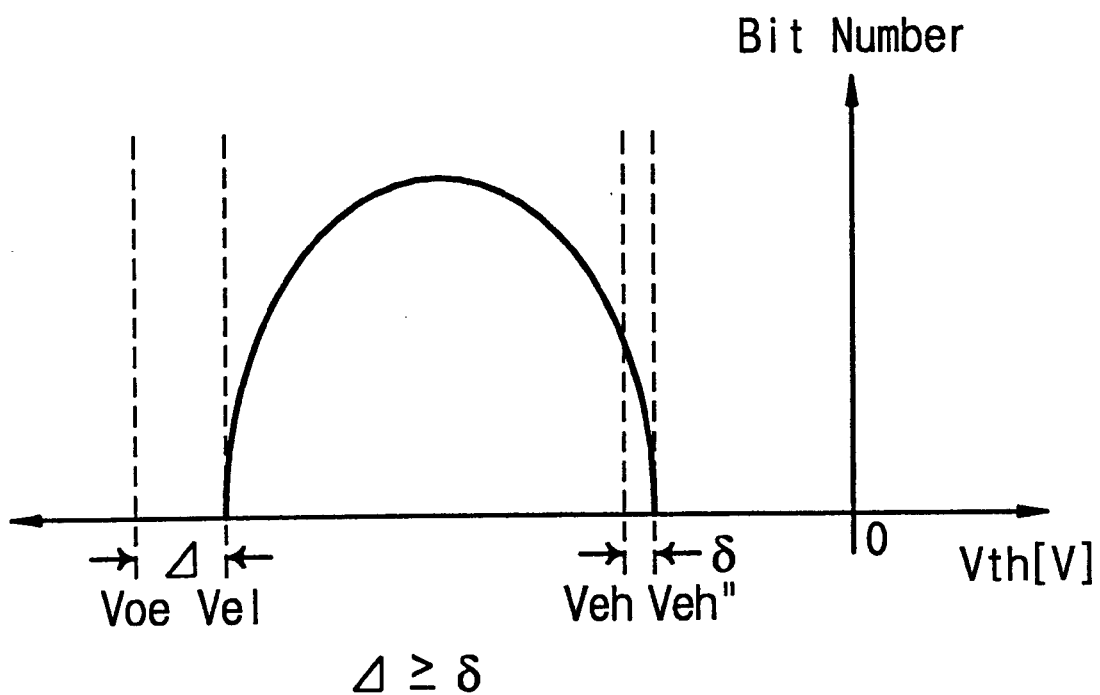
FIG. 13C is a graph representing the threshold voltage profile resulting from the methods of FIGS. 10 and 11.

In other words, after the BSP step (e.g., step S57 of FIG. 10 or step S61 of FIG. 11), which results in the threshold voltage profile including the over-erased memory cells shown in FIG. 13A being changed to the profile of FIG. 13B, there exists a threshold region C of over-post-programmed cells that is nearly under-erased or included in an under-erased region, where Veh' is moved an amount as much as δ+ from the upper erase voltage limit Veh. For the purpose of correcting this result, the BSE step (e.g., step S73 of FIG. 10 or step S81 of FIG. 11) is performed, and then the region C is removed by that the Veh' moves to Veh"(≈veh*) toward the negative direction as shown in FIG. 13C.

The BSP employed in the present invention is also called 'post-program'. It takes several microseconds ($\mu s$) for the post-program (or BSE) to operate, whereas the erasing time takes a matter of milliseconds (ms). Thus, it is much shorter time in the total erasing time.

According to the foregoing description, the method in the present invention can suppress an expansion of the threshold voltage profile caused by the over-erased memory cells after the erasing operation, thereby increasing the stability of the programming operation operated after the erasing operation.

Numerous modifications and variations of the present invention are possible in light of the above teachings. It is therefore to be understood that, within the scope of the appended claims, the present invention can be practiced in a manner other than as specifically described herein.

What is claimed is:

1. A method operable in a non-volatile memory device of a type having a plurality of blocks formed of a Plurality of memory strings in which a plurality of memory cells are connected in series in which a programming operation is conducted after erasing memory cells, the method comprising the steps of:

erasing data held in the memory cells in a unit of the block;

applying a soft program voltage to word lines coupled with the erased memory cells in the unit of the block; and performing an erasing operation for the erased and soft programmed memory cells by employing a soft erase voltage in the unit of the block.

2. The method of claim 1, wherein the soft program voltage is lower than a voltage employed in a programming operation of the memory cells, and the soft erase voltage is lower than an erase voltage employed in the erasing step.

3. The method of claim 1, wherein the soft program voltage is lower than a voltage employed in the program.

4. A method operable in a non-volatile memory device of a type having a plurality of blocks formed of a plurality of memory strings in which a plurality of memory cells are connected in series in which a programming operation is conducted after erasing memory cells, the method comprising the steps of:

erasing data held in the memory cells in a unit of the block;

applying a soft program voltage to word lines coupled with the erased memory cells in the unit of the block; and performing a verifying operation for the consequent memory cells of the applying step, and storing in a register the respective results of the verifying operation of whether the memory cells have passed or failed.

5. The method of claim 4, wherein the soft program voltage is lower than a voltage employed in the program.

6. The method of claim 4, wherein the soft program voltage is lower than a voltage employed in the program.

7. A method operable in a non-volatile memory device of a type having a plurality of blocks formed of a plurality of memory strings in which a plurality of memory cells are connected in series in which a programming operation is conducted after erasing memory cells, the method comprising the steps of:

erasing data held in the memory cells in a unit of the block;

performing a verifying operation for the erased memory cells; and storing a result about the memory cells which are determined to have failed in a register, and applying a soft program voltage to word lines coupled to the erased memory cells about the memory cells which are determined to have passed in the unit of the block.

8. The method of claim 7, wherein the soft program voltage is lower than a voltage employed in the program.

9. The method of claim 7, further comprising the step of performing the verifying operation for the soft programmed memory cells, storing a result about the memory cells which are determined to have failed in the register, and erasing the memory cells which are determined to have passed by using a soft erase voltage in the unit of the block.

10. The method of claim 9, wherein the soft program voltage is lower than a voltage employed in the program, and the soft erase voltage is lower than an erase voltage employed in the erasing step.

11. A method operable in a non-volatile memory device of a type having a plurality of blocks formed of a plurality of memory strings in which a plurality of memory cells are connected in series in which a programming operation is conducted after erasing memory cells, the method comprising the steps of:

erasing data held in the memory cells in a unit of the block;

applying a soft program voltage to word lines coupled with the erased memory cells in the unit of the block;

performing a first verifying operation forte consequent memory cells of the applying step, storing a result about the memory cells which are determined to have failed in a register, and erasing the memory cells which are determined to have passed using a soft erase voltage in the unit of the block; and performing a second verifying operation for the consequent memory cells of the first performing step, and storing in the register the respective results of whether the memory cells have passed or failed the second verifying operation.

12. The method of claim 11, wherein the soft program voltage is lower than a voltage employed in the program, and the soft erase voltage is lower than an erase voltage employed in the erasing step.

* * * * *

UNITED STATES PATENT AND TRADEMARK OFFICE
CERTIFICATE OF CORRECTION

PATENT NO.   : 6,594,178 B2
DATED        : July 15, 2003
INVENTOR(S)  : Choi et al.

It is certified that error appears in the above-identified patent and that said Letters Patent is hereby corrected as shown below:

Column 6,
Line 23, "voltage VpgmN/Vps, the" should read -- voltage Vpgm/Vps, the --.

Column 7,
Line 61, "step SS1, the" should read -- step S81, the --.

Column 8,
Line 15, "to Veh''(≈veh*)" should read -- Veh''(≈Veh*) --.

Column 10,
Line 15, "operation forte consequent" should read -- operation for the consequent --.

Signed and Sealed this

Thirteenth Day of September, 2005

JON W. DUDAS
*Director of the United States Patent and Trademark Office*